US010880511B2

(12) United States Patent
Xhakoni et al.

(10) Patent No.: US 10,880,511 B2
(45) Date of Patent: Dec. 29, 2020

(54) IMAGE SENSOR AND METHOD FOR READOUT OF AN IMAGE SENSOR

(71) Applicant: ams AG, Premstätten (AT)

(72) Inventors: Adi Xhakoni, Kessel Lo (BE); Jan Bogaerts, Katelijne Waver (BE)

( * ) Notice: Subject to any disclaimer, the term of this patent is extended or adjusted under 35 U.S.C. 154(b) by 0 days.

(21) Appl. No.: 16/347,917

(22) PCT Filed: Nov. 13, 2017

(86) PCT No.: PCT/EP2017/079047
§ 371 (c)(1),
(2) Date: May 7, 2019

(87) PCT Pub. No.: WO2018/095754
PCT Pub. Date: May 31, 2018

(65) Prior Publication Data
US 2019/0281245 A1    Sep. 12, 2019

(30) Foreign Application Priority Data
Nov. 22, 2016   (EP) .................................. 16200064

(51) Int. Cl.
*H04N 5/378*   (2011.01)
*H04N 5/369*   (2011.01)
(Continued)

(52) U.S. Cl.
CPC ............. *H04N 5/378* (2013.01); *H04N 5/379* (2018.08); *H04N 5/37455* (2013.01);
(Continued)

(58) Field of Classification Search
CPC .. H04N 5/3745; H04N 5/37455; H04N 5/378; H04N 5/379; H03M 1/123; H03M 1/145; H03M 1/164
See application file for complete search history.

(56) References Cited

U.S. PATENT DOCUMENTS

2010/0259662 A1*  10/2010  Oike ...................... H04N 5/335
                                                            348/308
2010/0276572 A1*  11/2010  Iwabuchi .............. H01L 23/481
                                                            250/208.1
(Continued)

FOREIGN PATENT DOCUMENTS

EP    2 239 937    10/2010
EP    2 860 965    4/2015

OTHER PUBLICATIONS

Arai et al., 6.9A 1.1μm 33Mpixel 240fps 3D-Stacked CMOS Image Sensor with 3-Stage Cyclic-Based Analogto-Digital Converters, ISSCC (2016); IEEE International Solid-State Circuits Conference, pp. 126-128.

(Continued)

*Primary Examiner* — Daniel M Pasiewicz
(74) *Attorney, Agent, or Firm* — Fish & Richardson P.C.

(57) ABSTRACT

An image sensor is proposed to have a stack with at least a pixel array tier and a control logic tier. The pixel array tier comprises an array of pixels which are arranged into pixel columns n, each pixel column n comprising a number of N sub-columns: Each sub-column is denoted by N(n,i) with $1 \leq i \leq N$. The control logic tier comprises an array of analog-to-digital-converters which are arranged into ADC columns m, wherein each analog-to-digital converter comprises a number of M stages. Each stage is denoted by M(m,j) with $1 \leq j \leq M$, Furthermore, each respective sub-column N(n,i) is electrically connected to a dedicated stage M(m,j=i) and the stages M(m,j) are electrically interconnected to form the analog-to-digital converters, respectively. The control logic tier is arranged to sequentially read out the sub-columns N(n,i), wherein the stages M(m,j=i) dedicated to the sub-columns N(n,i) are arranged as input stages to sequentially receive signal levels of the pixels in the sub-columns N(n,i), respectively. The input stages are arranged to perform on the (Continued)

sequentially received signal levels a coarse first analog-to-digital conversion. The remaining stages M(m,j≠i) are arranged to sequentially perform finer analog-to-digital conversions of the received signal levels.

15 Claims, 10 Drawing Sheets

(51) Int. Cl.
      *H04N 5/3745*    (2011.01)
      *H03M 1/12*      (2006.01)
      *H03M 1/16*      (2006.01)
      *H03M 1/14*      (2006.01)

(52) U.S. Cl.
      CPC ............ *H03M 1/123* (2013.01); *H03M 1/145* (2013.01); *H03M 1/164* (2013.01)

(56) References Cited

U.S. PATENT DOCUMENTS

2012/0307030 A1* 12/2012 Blanquart .......... A61B 1/00009
                                                                   348/76
2015/0288908 A1* 10/2015 Shen ................. H01L 27/14634
                                                                  348/308

OTHER PUBLICATIONS

European Patent Office, International Search Report for PCT/EP2017/079047, dated Feb. 19, 2018.

Xhakoni et al., "A Low-Noise High-Frame-Rate 1-D Decoding Readout Architecture for Stacked Image Sensors," IEEE Sensors Journal, vol. 14, No. 6, pp. 1966-1973, Jun. 2014.

* cited by examiner

FIG 8 (PRIOR ART)
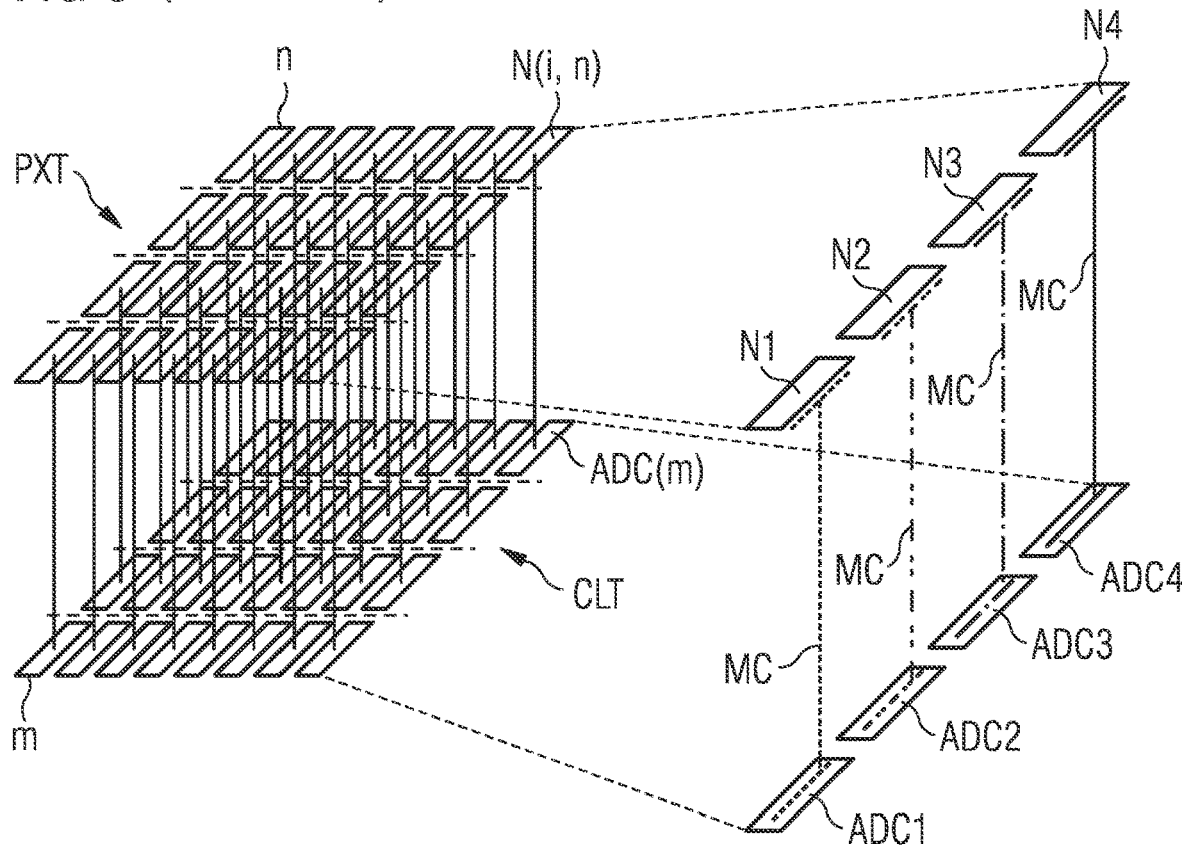
FIG 9 (PRIOR ART)
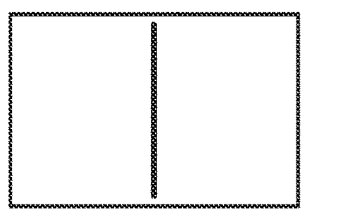
Global shutter
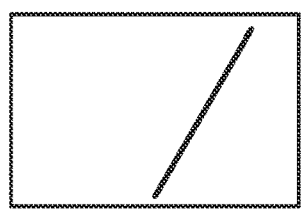
Rolling shutter (CIS)
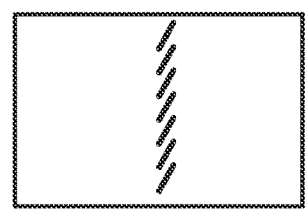
Discontinuous Rolling shutter
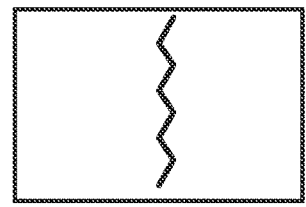
Zig-zag rolling shutter, inverted sub-column start

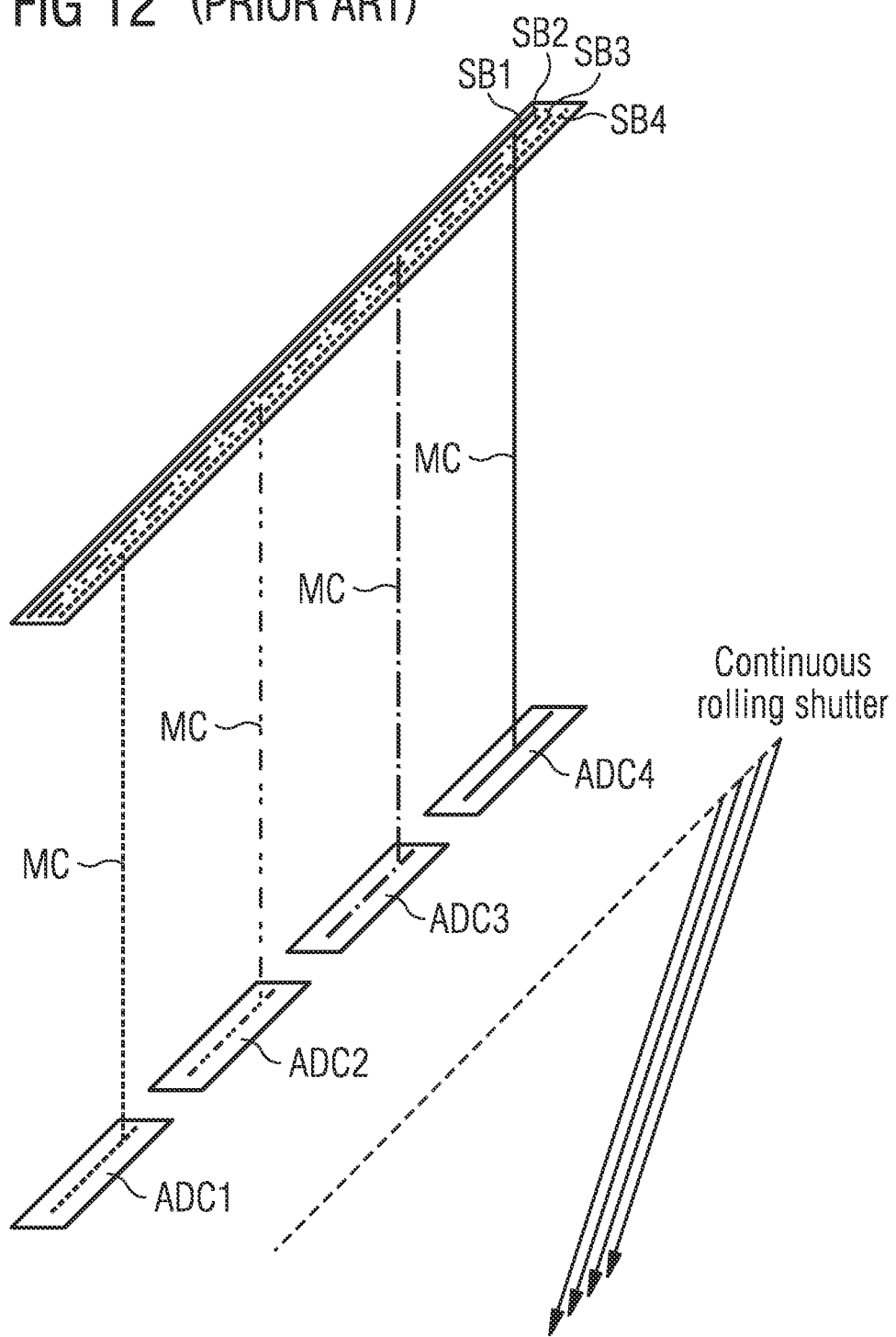

IMAGE SENSOR AND METHOD FOR READOUT OF AN IMAGE SENSOR

This invention relates to an image sensor and to a method for readout of an image sensor.

BACKGROUND OF THE INVENTION

Over the recent years CMOS image sensors have found increasing application in cameras for mobile devices such as smartphones, tablets and digital still cameras. Availability of image sensors in these devices goes along with an ever increasing demand for good image quality, low-light performance paired with high frame rates. Combining these properties into a single sensor has become a challenge. One way to cope with the demands is to increase parallelism of image sensors. 3D-stacking of wafers is widely used in today's high-end cell phone cameras and premium mirrorless cameras. 3D-stacked architectures or three-dimensional integrated circuits (3D-ICs) are integrated circuits manufactured by stacking two or more tiers, such as silicon wafers or dies, and inter-connecting them vertically so that they form a single device. It is expected to become the technology of choice in several industrial applications as well.

3D stacking of multiple silicon tiers allows for decoupling of optical performance of a sensor from readout circuit performance by placing a pixel array on a top tier and the readout circuitry on a bottom tier (denoted control logic tier hereinafter). In addition, compared to traditional single-tier imagers which employ column parallel readout circuits, for example, the stacked imagers can use sub-column parallel readout, improving the parallelism, and hence, frame rate. This parallelism remains constant at increased array resolution, ideally maintaining a constant frame rate at any spatial resolution.

Several concepts have been proposed to implement parallel readout architectures for 3D-stacked image sensors. For example, FIG. 8 shows a prior art stacked image sensor with a sub-column-parallel readout architecture based on sub-column parallel analog-to-digital converters, ADCs. The drawing depicts an image sensor comprising a stack having a pixel array tier PXT and a control logic tier CLT. Columns n of pixels in the array tier are split into N sub-columns N(i,n) while in the control logic layer there is a single dedicated ADC(m) for each sub-column of pixels. The dedictaed ADCs, e.g. ADC1, ADC2, ADC3, and ADC4 each are complete and independent analog-to-digital converters. This approach offers high speed due to high parallelism but at the cost of introducing a rolling shutter discontinuity or zig-zag since the sub-columns work in parallel (see FIG. 8). Furthermore, the implementation shows difficulties to transmit digital data to the periphery.

One issue with sub-column parallel readout architectures is rolling shutter discontinuity. Rolling shutter is a method of capturing an image by scanning across the field of view of an image sensor rapidly, either vertically or horizontally. This method avoids taking a snapshot of the entire field of view at a single instant in time. As a consequence parts of the image are recorded at exactly the same instant and others are not. This produces predictable distortions of fast-moving objects or rapid flashes of light, for example. Such rolling shutter discontinuity can be mitigated by using "global shutter pixels" in which at least parts of the frame are captured at the same instant in time. However, in most cases 3D-stacked imagers require back-side illumination technology, which is not favorable to global shutter pixels due to considerable reduction of shutter efficiency as there are less means available for shielding of the storage area.

FIG. 9 shows several examples of shutter phenomena. The drawings depicts some issues with conventional stacked readout architectures which are based on sub-column ADCs, e.g. as shown above in FIG. 8. A straight object has no distortion when captured by a global shutter sensor. When captured by a rolling shutter sensor, the straight object gets distorted, with a certain slope steepness. When captured by a sensor with sub-column parallel ADCs, the object becomes discontinuous, with a slope steepness similar to that of the conventional rolling shutter sensor. Alternatively, when adjacent sub-columns invert the direction of the readout of pixels, a zig-zag rolling shutter discontinuity is present.

FIG. 10 shows the rolling shutter discontinuity when sub-columns of pixels N1, N2, N3, N4 are read by analog-to-digital converters ADC1, ADC2, ADC3, ADC4, respectively, in the same direction or zig-zag effect when adjacent sub-columns are read in the opposite direction. Other problems with sub-column parallel readout circuitry relate to a difficulty to transmit digital code from analog-to-digital converters, ADCs, in the center of the sensor array to I/O drivers, e.g. Low Voltage Differential Signaling, LVDS, on a peripheral side of the image sensor chip, especially at large format sensors. Also, several applications require windowing, i.e. reduction of array resolution, in order to increase the frame rate under specific conditions. Unfortunately, in conventional 3D-stacked architectures windowing reduces the number of sub-columns, and, hence, the number of the ADCs which is not always desirable.

FIG. 11 shows another 3D-stacked image sensor. An integer number of N parallel signal buses SB(n) are placed within a column of pixels n. Additionally, a number of N ADCs are arranged in a control logic tier CLT and are designed to convert pixel information sequentially via the rather long and continuous signal buses. In other words the ADCs, e.g. ADC1, ADC2, ADC3, and ADC4 each are complete and independent analog-to-digital converters. The implementation allows all the ADCs within a column to access all the pixels of the column sequentially, thus avoiding the rolling shutter discontinuity (see FIG. 12). This comes at the cost of a considerably large parasitic cap at the output of the pixels which increases the pixel output settling time, a large bus resistance that reduces the pixel swing hence the dynamic range, and difficulties to transmit digital data to the periphery.

It is to be understood that any feature described in relation to any one embodiment may be used alone, or in combination with other features described hereinafter, and may also be used in combination with one or more features of any other of the embodiments, or any combination of any other of the embodiments, unless explicitly described as an alternative. Furthermore, equivalents and modifications not described below may also be employed without departing from the scope of the image sensor and the method for readout of an image sensor as defined in the accompanying claims.

SUMMARY OF THE INVENTION

In at least one embodiment an image sensor comprises a stack having at least a pixel array tier and a control logic tier. The pixel array tier comprises an array of pixels arranged into pixel columns. Each pixel column comprises a number of N sub-columns. Each sub-column is denoted by N(n,i) with $1 \leq i \leq N$. The control logic tier comprises an array of analog-to-digital converters. The analog to digital converters each comprise a number of M stages, each stage is denoted by $M(m,j)$ with $1 \leq j \leq M$. Each sub-column $N(n,i)$ in the pixel array tier is electrically connected to a dedicated stage $M(m,j=i)$ in the control logic tier. The stages within a given analog-to-digital converter are electrically interconnected in series. By way of interconnecting the stages the analog-to-digital converters are formed, respectively.

The control logic tier is arranged to sequentially read out the sub-columns. Readout is initiated by the stages $M(m,j=i)$ dedicated to the sub-columns $N(n,i)$ as input stages. During readout of a sub-column the input stages sequentially receive signal levels of the pixels in the sub-column being read out via the dedicated stages. The dedicated stages are arranged to perform on the sequentially received signal levels a coarse first analog-to-digital conversion. The remaining stages, i.e. the stages not acting as dedicated input stages, are arranged to sequentially perform finer analog-to-digital conversions of the received signal levels.

In at least one embodiment every sub-column $N(n,i)$ in the pixel array tier is electrically interconnected with a dedicated stage $M(m,j=i)$ in the control logic tier. In other words for every sub-column in the top pixel array tier there is a dedicated stage in the bottom control logic tier. Consequently, N equals M.

In at least one embodiment the number N' of sub-columns $N(n,i)$ in the pixel array tier are connected to dedicated stages $M(m,j=i)$ in the control logic tier. The number of sub-columns is either greater than the number of stages M or smaller than the number of stages M. As a consequence not every stage in the control logic tier may act as a dedicated input stage or the reverse a stage may act as dedicated input stage for more than a single sub-column.

In at least one embodiment the stages in the analog-to-digital converters are mono-directional or bi-directional. This way digital code and/or quantization error signals may be shifted to one or more than one stages at a time.

In at least one embodiment each of the analog-to-digital converters comprises at least one of a pipeline analog-to-digital converter, a ramp analog-to-digital converter, an extended counting type analog-to-digital converter or a successive approximation type analog-to-digital converter.

In at least one embodiment each stage is arranged to perform a most significant bit and least significant bit conversion.

In at least one embodiment the pixel array tier and/or the control logic tier comprises peripheral logic and/or digital drivers.

In at least one embodiment the control logic tier comprises sub-control tier. At least one of the stages, the peripheral logic and/or the digital drivers are distributed over the sub control tiers. For example, one sub-control tier may have analog components only while another sub-control tier may have digital components only.

In at least one embodiment the electrical interconnections between pixel sub-columns in the pixel array tier and their corresponding dedicated stages in the control logic tier comprise at least one of metal contact, through substrate vias or through silicon vias, wafer-to-wafer or die-to-die interconnect.

In at least one embodiment an image sensor comprises a stack having at least a pixel array tier and a control logic tier. The pixel array tier comprises an array of pixels arranged into pixel columns, wherein each column comprises a number of N sub-columns. The control logic tier comprises an array of analog-to-digital converters arranged into columns, wherein each analog-to-digital converter comprises a number of stages. A method to read out an image from the image sensor comprises the following steps.

The sub-columns are sequentially read out using stages dedicated to the sub-columns as input stages. The input stages sequentially receive signal levels of pixels in the sub-columns pixel by pixel, respectively. On the sequentially received signal levels a coarse first analog-to-digital conversion is performed using the dedicated input stages, respectively. Sequentially, finer analog-to-digital conversions are performed of the received signal levels using the remaining stages, respectively.

In at least one embodiment the sub-columns are selected in a sequence from 1 to N. For each selected sub-column the following steps are repeated pixel by pixel.

A signal level is read out from a first pixel in the selected sub-column and said signal level is received at the dedicated stage as input stage. A first digital code and a first quantization error signal are generated as a result of the coarse first analog-to-digital conversion on the received signal level using the dedicated input stage. Sequentially, the finer further analog-to-digital conversions are performed using the remaining stages. In each finer conversion step further digital code and further quantization signals are generated in a sequential manner. The further digital code and further quantization signals, together with the first digital code and first quantization error signal, are shifted to one or more of the remaining stages. Finally, from the generated digital code a final digital code is constructed and is indicative of the read-out signal level of the first pixel. The steps recited above are repeated for second, third pixels an so on until all pixels in the selected sub-column have been read out. Then, the read out may proceed by selecting another sub-colum for read out and repeating the above steps for its pixel in the same manner.

In at least one embodiment the first digital code of the pixel is read out and results from determining a most significant bit, MSB. The further digital code from said pixel result from determining and the least significant bit, LSB, respectively.

In at least one embodiment the pixels from the selected sub-column are processed in parallel. Thereby, after the first digital code from the first pixel in a selected sub-column has been determined a finer further analog-to-digital conversions are performed on said pixel. At the same time another pixel is selected from the selected sub-column and read out by the same dedicated stage and a respective (another) first digital code from the another pixel is determined, respectively. This process is repeated for all pixels in the sub-column. Then, another sub-column may be read out using the same sequence of steps.

In at least one embodiment sequentially performing the first coarse and the subsequent finer analog-to-digital conversions is performed mono-directional involving shifting of the respectively generated digital code and quantization error signals to just a single stage of the remaining stages the time. The term "mono-directional" indicates that digital code is only shifted in one direction and not sent back to a previous stage during the process.

In at least one embodiment sequentially performing the first coarse and the subsequent finer analog-to-digital conversions is performed bi-directional involving shifting of the respectively generated digital code and quantization error signals to more than just a single stage of the remaining stages at a time. The term "bi-directional" indicates that digital code may be shifted in more than one direction and more than just a single stage, i.e. a previous stage can be used more than once during the process.

The proposed concepts can be used to reduce rolling shutter discontinuity, reduce transmission time of the digital code from ADCs to peripheral drivers and aims to further improve the frame rate when windowing is used. The latter aspects apply to both rolling shutter and global shutter sensors. One aspect is as follows. Each column of the imager can be split into N sub-columns. In the second tier, column-parallel ADCs, e.g. pipeline ADCs, are split into M stages. Typically M equals N, i.e. there is one stage below each sub-column of the pixel array. All the stages of the ADCs are the same and perform a low resolution analog-to-digital conversion and provide at their output an analog value of the amplified quantization error.

In at least one of the embodiment, each sub-column is readout sequentially. When sub-column $N(n,i)$ is being read where $1 \leq i \leq N$, and $M=N$, the dedicated stage $M(m,j=i)$ of the $ADC(m)$ performs the MSBs conversion of such sub-column while the other stages $M(m,j \neq i)$ perform, sequentially, the finer conversion. The digital code (e.g. 1 bit per stage) is transferred sequentially stage after stage to the periphery of the chip. When sub-column $N(n,i-1)$ is read, dedicated stage $M(m,j=i-1)$ performs the MSBs conversion while the other stages perform the finer conversion providing the other bits and so on.

At least one configuration where an analog-to-digital converter is split stages $M(m,j)$ can perform the MSB of sub-column $N(n,i)$ has several advantages. A common configuration where a conventional M-stage pipeline ADC with the MSB conversion in the first stage would require a very long signal bus along the pixel column to connect the output of the pixel to the input of the first stage of the ADC. This considerably increases the settling time and reduces the dynamic range of the sensor due to the voltage drop along the resistive column bus. On the contrary, following the proposed concepts, stages $M(m,j=i)$ of the pipeline ADC provide the MSBs of the pixels of sub-column $N(n,i)$, e.g. where $1 \leq i \leq N$ and $M=N$. A column bus parasitic cap and resistance can both be reduced by a factor of N.

All the sub-columns are readout sequentially, hence largely avoiding the rolling shutter discontinuity, but all the ADCs can work in parallel, achieving a very fast readout speed. As explained above, the sub-columns of pixels have a very short settling time as their parasitic cap is reduced by N times. It follows that the sequential access of the pixels has little impact on the speed of the readout operation. When a windowing is applied to the sensor, less sub-columns would be read out by the ADCs. However, in the proposed concepts all the stages of the ADCs can be used to perform the conversion of a pixel at a time hence the windowing does increase the frame rate as opposed to the sensor of FIG. 8, for example.

The proposed concepts with N sub-columns and M-stages MSB reconfigurable ADCs solves the pitfalls of state of the art 3D-stacked readout architectures, including:
  Avoiding rolling shutter discontinuity/zig-zag while maintaining a very high parallelism, hence, frame rate
  Further increasing the frame rate in windowing mode
  Shifting in an easier fashion digital code from the ADC stages in the middle to the ADC stages in the periphery and afterwards to the I/O drivers
  Maintaining low parasitic cap and resistance at the output of the pixels while allowing fast pixel access time and full voltage swing
  Scalability, i.e. can be used at different pixel pitches, pixel grouping.

In the following, the concept presented above is described in further detail with respect to drawings, in which exemplary embodiments are presented.

In the exemplary embodiments and Figures below, similar or identical elements may each be provided with the same reference numerals. The elements illustrated in the drawings and their size relationships among one another, however, should not be regarded as true to scale. Rather individual elements, such as layers, components, and regions, may be exaggerated to enable better illustration or improved understanding.

BRIEF DESCRIPTION OF THE DRAWINGS

FIG. 8 shows a prior art stacked image sensor, FIG. 9 shows several examples of shutter phenomena, FIG. 12 shows another prior art stacked image sensor.

DETAILED DESCRIPTION

Figure 1:
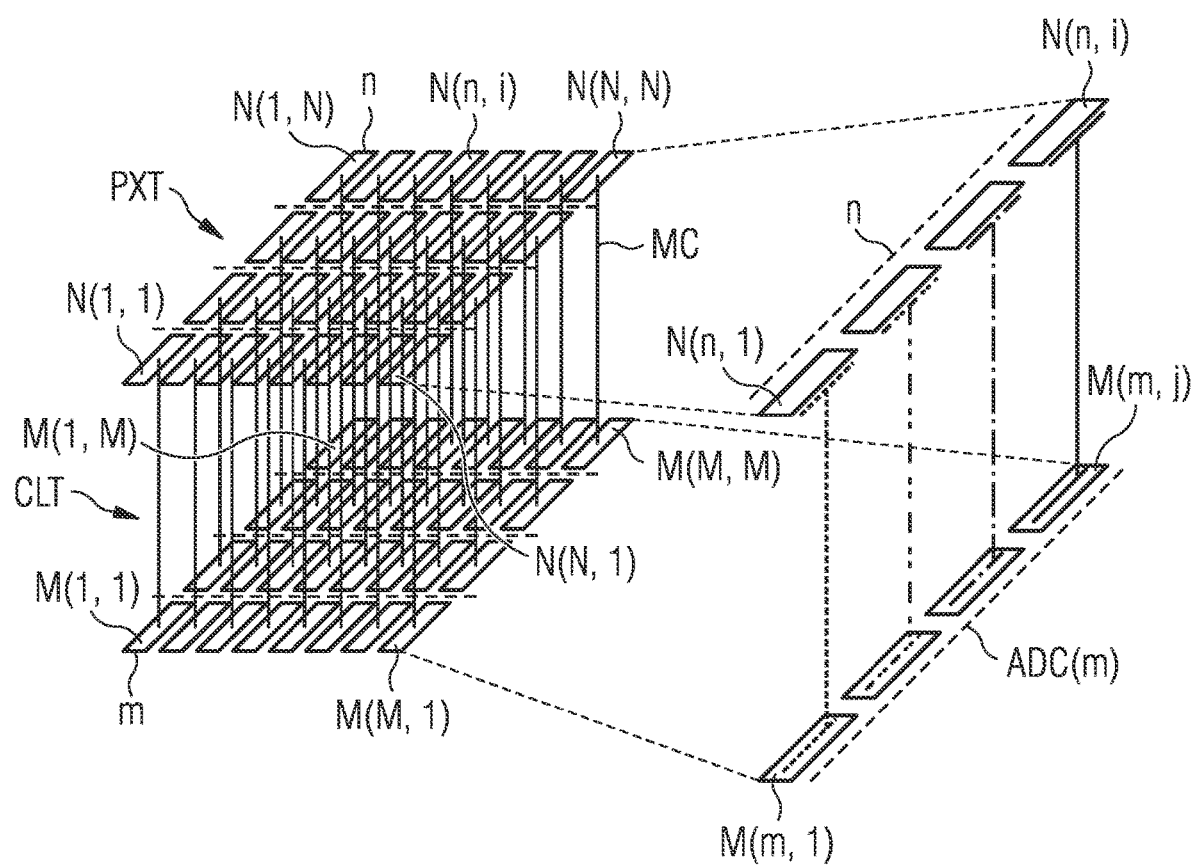
FIG. 1 shows an exemplary stacked image sensor according to the proposed concepts.

FIG. 1 shows an exemplary stacked image sensor according to the proposed concepts. The left side of the drawing depicts a top pixel array tier PXT and a bottom control tier CTL which are stacked by means of 3D-stacking and thereby forming the image sensor. The right side of the drawing shows exemplary columns n of the pixel array tier PXT and dedicated columns if the control tier CTL. The two tiers PXT, CTL are electrically interconnected face-to-face through micro-contacts MC, i.e. metal contacts of the top pixel array tier PXT face metal contacts of the bottom control logic tier CTL. Other interconnect technologies such as through-silicon-vias, silicon vias wafer-to-wafer or die-to-die interconnect are possible as well.

The pixel array tier PXT comprises an integrated circuit having an array of pixels. Examples include CMOS image sensor and CCD technology. For example, each pixel comprises a photodetector, e.g. a four transistor cell (4T cell) having a pinned photodiode, a floating diffusion, a transfer gate, a reset gate, a selection gate and a source-follower readout transistor. However, the image sensor may generally be active or passive. The pixels of the array are arranged into columns n. Each column n is subdivided into a number of N sub-columns. Hereinafter each sub-column is denoted by $N(n,i)$, wherein i is an integer number with $1 \leq i \leq N$. For example, the pixel array tier PXT comprises a first column having sub-columns $N(1,1), \ldots, N(1,N)$. A N'th column has sub-columns $N(1,N), \ldots, N(N,N)$.

The control logic tier CLT comprises an integrated circuit with an array of analog-to-digital converters, ADC. In this embodiment the ADCs are arranged in parallel columns, i.e.

the array of analog-to-digital converters comprises several columns, wherein each column is denoted by an integer number m and comprises a single analog-to-digital converter, denoted by ADC(m). Furthermore, each analog-to-digital converter ADC(m) comprises an integer number of M stages, each stage denoted by M(m,j), with $1 \leq j \leq M$. For example, the control logic tier CLT comprises a first ADC column having stages M(1,1), . . . , M(1,M). A M'th ADC column has stages M(1,M), . . . , M(M,M).

The individual analog-to-digital converters ADC(m) are typically of a pipeline type, i.e. capable of splitting their analog-to-digital conversion into M multiple pipeline stages. However, other types of ADCs such as extended counting, ramp, successive approximation, SAR, and others can be split into multiple stages and therefore be used for the implementation of the proposed image sensor.

In this embodiment the number of stages M equals the number of sub-columns N, i.e. below each sub-column in the pixel array tier PXT there is a corresponding stage M in the control logic tier CLT. The corresponding stage will be denoted a dedicated stage M(m,j=i) hereinafter. The remaining stages, i.e. all stages in a given column m not dedicated to a sub-column N(n,i) in the pixel array tier PXT, will be denoted as remaining stages M(m,j) with i≠j or M(m,j≠i) for short. Every sub-column N(n,i) is electrically interconnected with its dedicated stage M(m,j=i), e.g. by means of the micro-contacts MC mentioned above. As can be seen in FIG. 1 there may be a single micro-contact MC connecting every sub-column to its dedicated stage, respectively.

The control logic tier CLT is designed to sequentially read out the sub-columns N(n,i). The control logic tier CLT may be complemented with a readout circuit which may completely be arranged in the control logic tier CLT or at least parts of the readout circuit may also be distributed on the pixel array tier PXT or sub-control logic tiers. The readout circuit may be complemented with peripheral logic and digital drivers. For example, the readout circuit comprises blocks of horizontal scanners, current mode logic (CML) circuits, digital processing circuits, and scalable low voltage signaling (SLVS) drivers. However, the readout circuit and its possible further building blocks are not depicted in the drawing for easier representation of the proposed concepts. Together with the array of analog-to-digital converters ADC(m) the readout circuit provides means to read out the pixels arranged in the pixel array tier PXT.

During image acquisition light is collected by means of the pixels arranged in the pixel array. At the end of an exposure each pixel holds a certain pixel signal level. The pixel signal levels constitute analog input signals which are read out and transferred to the control logic tier CLT and input into the dedicated input stages M(m,j=i), respectively. The control logic tier CLT is arranged to control the operation of the analog-to-digital converters ADC(m) to sequentially read out the sub-columns N(n,i) in the pixel array tier PXT.

The proposed readout method will be discussed in further detail and with respect to the following Figures. Briefly, however, the stages M(m,j=i) dedicated to the sub-columns are the input stages for their dedicated sub-columns N(n,i), respectively. For example, in column m=1 stage M(1,1) is the input stage for sub-column N(1,1), stage M(1,2) is the input stage for sub-column N(1,2) and so on (assume m=n if there are as many columns in the pixel array tier as there are in the control logic tier). This example is depicted in FIG. 2.

The columns are read out sequentially, i.e. sub-column after sub-column. Furthermore, each sub-column is read out sequentially, too, i.e. pixel-by-pixel. As a consequence the dedicated stages M(m,j=i) sequentially receive signal levels of the pixels in the respective sub-columns N(n,i). With each readout step in the sequence the input stages perform on the received signal levels a coarse first analog-to-digital conversion. The remaining stages M(m,j≠i) sequentially perform finer analog-to-digital conversions of the received signal levels. For example, stage M(m,j=i) of ADC(m) is designed to perform a most significant bit, MSB, conversion of the dedicated sub-column N(n,i) and the remaining stages M(m,j≠i) perform a least significant, LSB, conversion of the other sub-columns. Thus, the sub-columns are read out sequentially pixel-by-pixel. A particular pixel is read out and the stages sequentially perform in a first step a coarse and in successive steps finer conversions until a complete digital code corresponding to the signal level of the respective pixels is established. However, the stages of the ADCs work in parallel. For example, after a pixel signal level has been coarsely converted in the first step the result is shifted from its dedicated stage to a next stage where a finer conversion is performed. At the same time the dedicated stage is free to read out another pixel from the sub-column and again perform a coarse conversion on this second pixel. These steps are repeated pixel-by-pixel and the corresponding conversion results are refined in a stepwise manner until a complete digital code can be reconstructed. Thus, even though the sub-columns are readout sequentially the ADCs work in parallel, achieving a fast readout speed.

The pixels of a column m are accessed sequentially through short buses via the micro-contacts. This way, there is no need for long (hence highly capacitive and resistive) column buses to achieve continuous rolling shutter. The sequential readout of the sub-columns avoids rolling shutter discontinuity. Furthermore, the sub-columns of pixels have a short settling time as their load is limited (short sub-column bus) resulting in a very fast pixel access time. It follows that the sequential access of the pixel has little impact on the speed of the readout operation. In addition, when windowing is applied, less sub-columns would be read out by the ADCs. However, in the proposed concepts all the stages of the ADCs can be used to perform the conversion of a pixel at a time hence the windowing does increase the frame rate.

Figure 2:
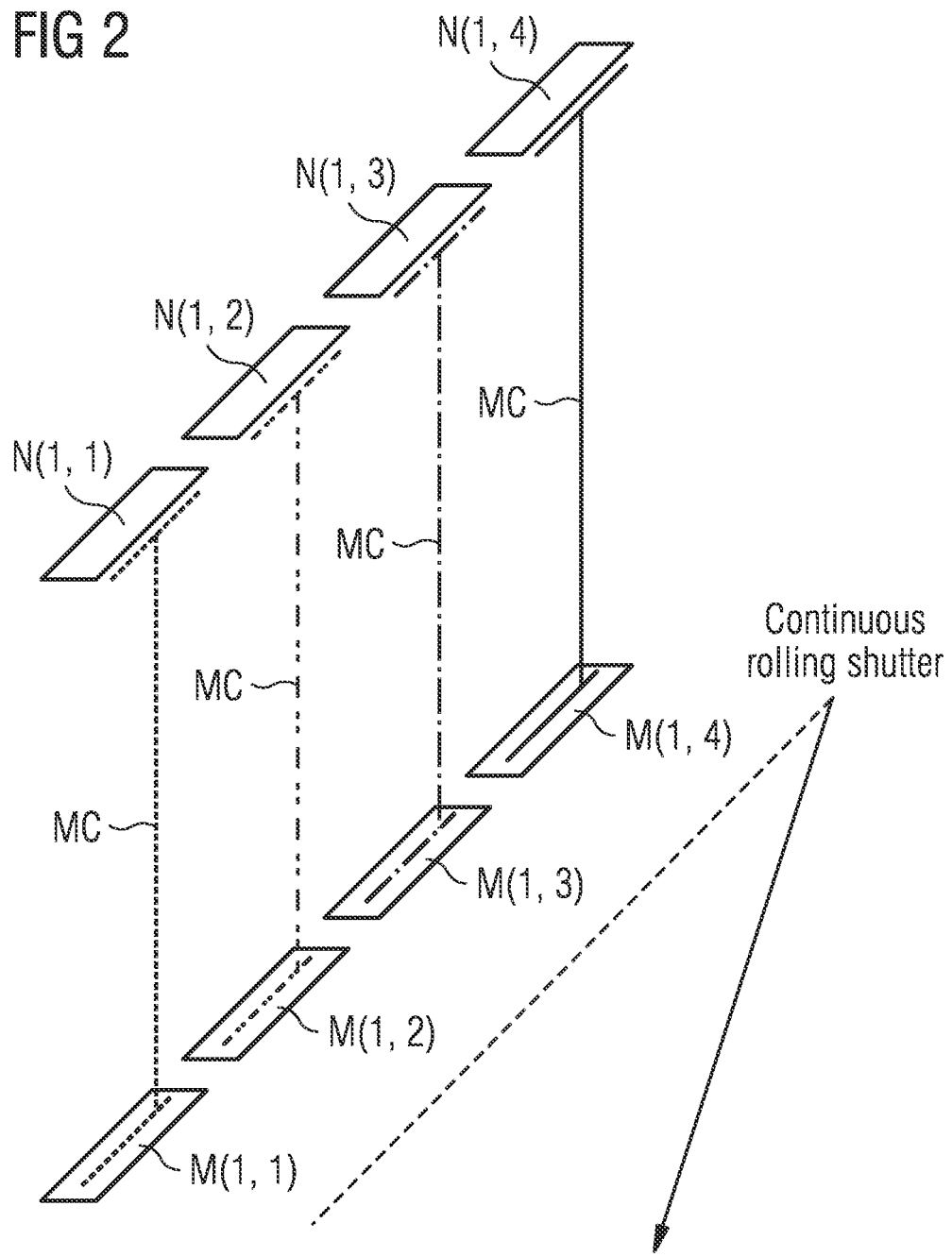
FIG. 2 shows an exemplary column of the stacked image sensor according to the proposed concepts.

FIG. 2 shows an exemplary column of the stacked image sensor according to the proposed concepts. The drawing derives from the right part of FIG. 1 and illustrates the continuous rolling shutter effect of the proposed technique. In fact, the sub-columns are readout sequentially which allows for avoiding the rolling shutter discontinuity.

Figure 3:
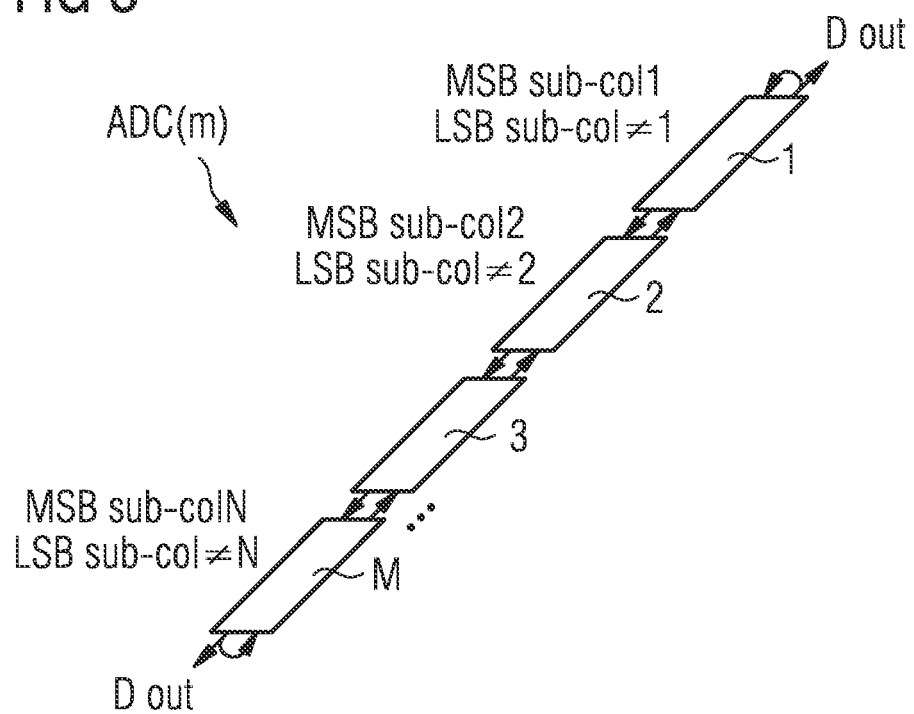
FIG. 3 shows an exemplary readout method according to the proposed concepts.

FIG. 3 shows an exemplary readout method according to the proposed concepts. The drawing depicts an analog-to-digital converter comprising M stages forming a pipeline for pixel readout in further detail.

Each ADC(m) constitutes a pipeline for pixel readout and analog-to-digital conversion (see drawing on the right side of FIG. 1). In more detail, all the stages M(m,j) of a particular analog-to-digital converter ADC(m) are of the same type and are arranged to perform low resolution analog-to-digital conversions. The stages M(m,j) have an input to receive a digital input signal and another input to receive an analog quantization error signal. Correspondingly, each stage M(m,j) has an output to provide a digital output signal and another output to provide an analog quantization error signal. The stages M(m,j) of any analog-to-digital converter ADC(m) in the control logic tier CLT are electrically interconnected in series via their corresponding inputs and outputs to form a column m of the array of analog-to-digital converters, i.e. a single analog-to-digital converter ADC(m), e.g. by means of signal buses. Furthermore, each stage M(m,j) comprises an amplifier to amplify at their output an analog signal level of the quantization error signal (not shown).

The pixel signal levels can be received via the micro-contacts MC connecting the sub-columns N(n,i) with the dedicated stages M(m,j), respectively. In other embodiments signal may be transmitted using through substrate vias, through silicon vias, wafer-to-wafer or die-to-die interconnect technology.

Each stage M(m,j) of an analog-to-digital converter ADC (m) can perform a most significant bit, MSB, conversion and a least significant bit, LSB, conversion. For simplicity assume that the number of stages M equals the number of sub-columns N. Furthermore, assume N=M=12 and that each stage M(m,j) of an analog-to-digital converter ADC(m) has a resolution of 1-bit. Furthermore, assume that each column n in the pixel array tier PXT is attributed a column m of analog-to-digital converters in the control logic tier CLT, i.e. n=m. It follows that analog-to-digital converters have a resolution of 12 bits. In such a configuration, stage M(n,i), with $1 \le i \le N$ and i=j, converts the MSB of the pixels of sub-column N(n,i), the MSB-1 bit of sub-column N(n,i−1), the MSB-2 bit of sub-column N(n,i−2) and so on.

In more detail, a given sub-column N(n,i) is read out pixel-by-pixel such that the signal levels of the pixels in the pixel array tier are first input into their respective dedicated input stage M(m,j=i) pixel-by-pixel. Thus, an input signal of an ADC stage M(m,j) is the signal level of a pixel of sub-column N(n,i) when such sub-column is being readout. The dedicated input stages M(m,j=i) perform a first low resolution analog-to-digital conversions of the input analog voltage, i.e. signal level of the pixels. Then, the stages provide at their output a first digital code of the first conversion together with a first amplified value of a quantization error after the conversion, in form of an analog voltage. Such first quantization error signal in form of an analog voltage is then sequentially shifted to the remaining stages M(m,j) and refined by the next stages of the ADC.

Refinement by the next ADC stages is performed sequentially as well. The bit representing the first digital code of the first conversion of the dedicated input stages N(n,i) is shifted to its neighboring ADC stage N(n,i+1) together with the first quantization error signal in form of an analog voltage. The neighboring ADC stage N(n,i+1) performs a second low resolution analog-to-digital conversion of the first input analog quantization error signal. Then, the stage N(n,i+1) provides at its output a second digital code of the conversion together with a second amplified value of the quantization error after the second conversion, in form of an analog voltage. Again, the bit representing the second digital code of the second conversion of the stage N(n,i+1) is shifted to its neighboring ADC stage N(n,i+2) together with the second quantization error signal in form of an analog voltage. The neighboring ADC stage N(n,i+2) performs a third low resolution analog-to-digital conversion of the second input analog quantization error signal and so on. This digital code shifting is performed until the digital code reaches the edge of the column, as seen in FIG. 3, for example. In that case, the digital code is transferred to readout circuitry, e.g. peripheral logic where the full ADC code is reconstructed and is then sent off-chip through digital drivers. The shifting of digital code can be done between the stages, i.e. each stage receives the digital code from one or more previous stages, i.e. together with the quantization error signal from the previous stage. However, the digital code can also be collected independently from the stages and be transferred to the readout circuitry when it has been established from a given stage. The readout circuitry collected the digital code into the ADC code.

The method steps presented so far implement a digital shifting readout scheme for one pixel. However, once a dedicated input stage has shifted the digital code from the first conversion and the quantization error signal for that pixel to the next stage, the dedicated input stage is ready to receive the signal level of a next pixel. In other words the pixels in the sub-columns N(n,i) are read out sequentially while the stages M(m,j) of the analog-to-digital converters work in parallel. Depending on the sub-column N(n,i) a given stage M(m,j) may act as a dedicated input stage M(m,j=i) or as one of the remaining stages M(j±1), . . . , M(j±M) with i≠j. Thus, the proposed method for read out of the image sensor involves shifting digital code stage-by-stage in small packets to a periphery of the control logic tier CLT. At the periphery the digital code is received by means of the readout circuit, e.g. by Low Voltage Differential Signaling, LVDS, digital drivers. Parallel read out is established by arranging the stages to work in parallel.

FIG. 3 shows this concept schematically. Depicted is an exemplary pipelined analog-to-digital converter ADC(m). For the sake of explanation assume this ADC in column m comprises M stages denoted by 1, 2, . . . , M. Further assume that stage 1 is the dedicated stage of a sub-column denoted as sub-column1 for short. Then stage 2 is dedicated to sub-column2 and so on. Finally, stage M is dedicated to sub-columnN. In this configuration stage 1 is arranged to convert the MSB of sub-column1 and the LSB of all remaining sub-columns≠1. Correspondingly, stage 2 is arranged to convert the MSB of sub-column2 and the LSB of all remaining sub-columns≠2 and so on. Finally, stage M is arranged to convert the MSB of sub-columnN and the LSB of all remaining sub-columnsØN. Stages 1 and M are arranged at the periphery of the control logic tier CLT and provide the digital code Dout from the consecutive analog-to-digital conversions.

In this embodiment each stage is bi-directional such that an output signal from one stage can be sent back to both its neighboring stages, e.g. for further quantization noise refinement. Bi-directional stages 1, . . . , M allow for the input of stage 'k' to come from stage 'k+1' or from stage 'k−1', with k=1, . . . , M. Similarly, the output of stage 'k' can be sent to stage 'k+1' or to stage 'k−1'. Eventually, with such a configuration, the stages 1, . . . , M of the ADC can be lower in number compared to the sub-columns within a column, e.g. M<N instead of M=N. This can be done by performing multiple loops of the stages. For instance, with only four stages of 1-bit resolution each, a 12-bit ADC resolution can be achieved by using three loops. Correspondingly, not every stage may be a dedicated input stage to just a single corresponding sub-column. For example, a stage could be addressed as dedicated input stage to a sub-column by switches which could be controlled by the control logic tier CLT.

Figure 4:
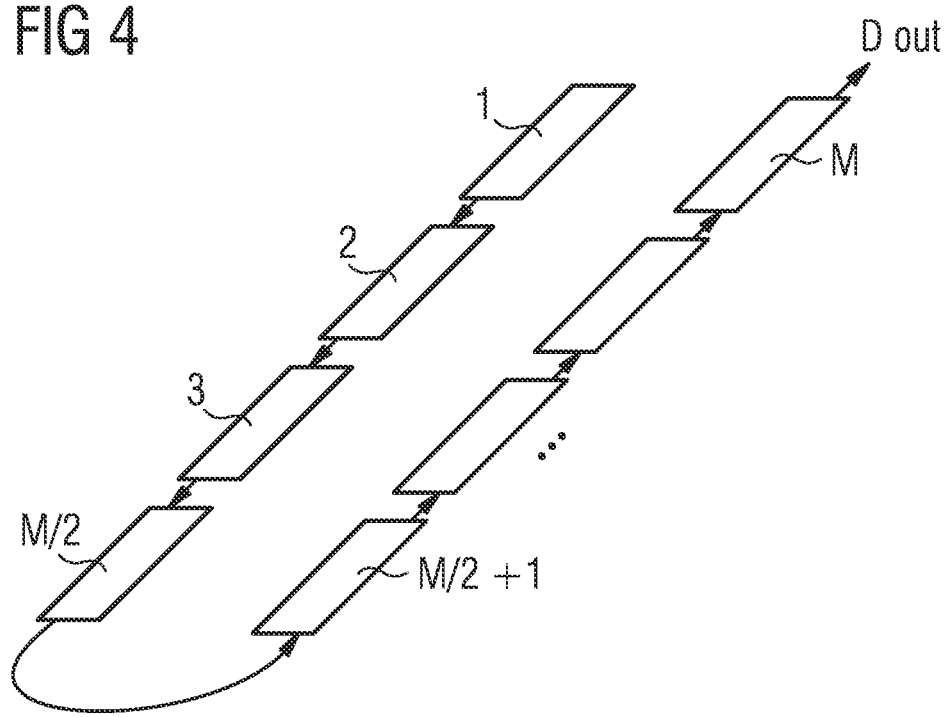
FIG. 4 shows another exemplary readout method according to the proposed concepts.

FIG. 4 shows another exemplary readout method according to the proposed concepts. This embodiment corresponds to the one in FIG. 3 but the columns n of the top pixel array tier PXT are split into N=M/2 sub-columns and the analog-to-digital converter ADC(m) of the control logic tier CLT are split into M mono-directional stages 1, . . . , M/2, . . . , M as shown in FIG. 4. Pipeline of ADC stages is split into a first branch comprising stages 1, . . . , M/2 and a second branch comprising stages M/2+1, . . . , M. Correspondingly, not every stage may be a dedicated input stage to just a single corresponding sub-column. For example, every other stage could be by a dedicated input stage to a sub-column and the remaining stages are not. Consequently, with such a configuration, the stages of the ADC can be larger in number compared to the sub-columns within a column, e.g. M>N instead of M=N. This arrangement can be referred to as snake-shape ADC placement. Such configuration provides another way to decouple the number of sub-columns from the number of stages of the ADCs.

Alternatively, a snake-shape placement with more than two branches can be used. For instance, if three branches are used, each column of pixels would be split into N=M/3 sub-columns and each branch of the ADC would be split into M/3 stages.

Figure 5:
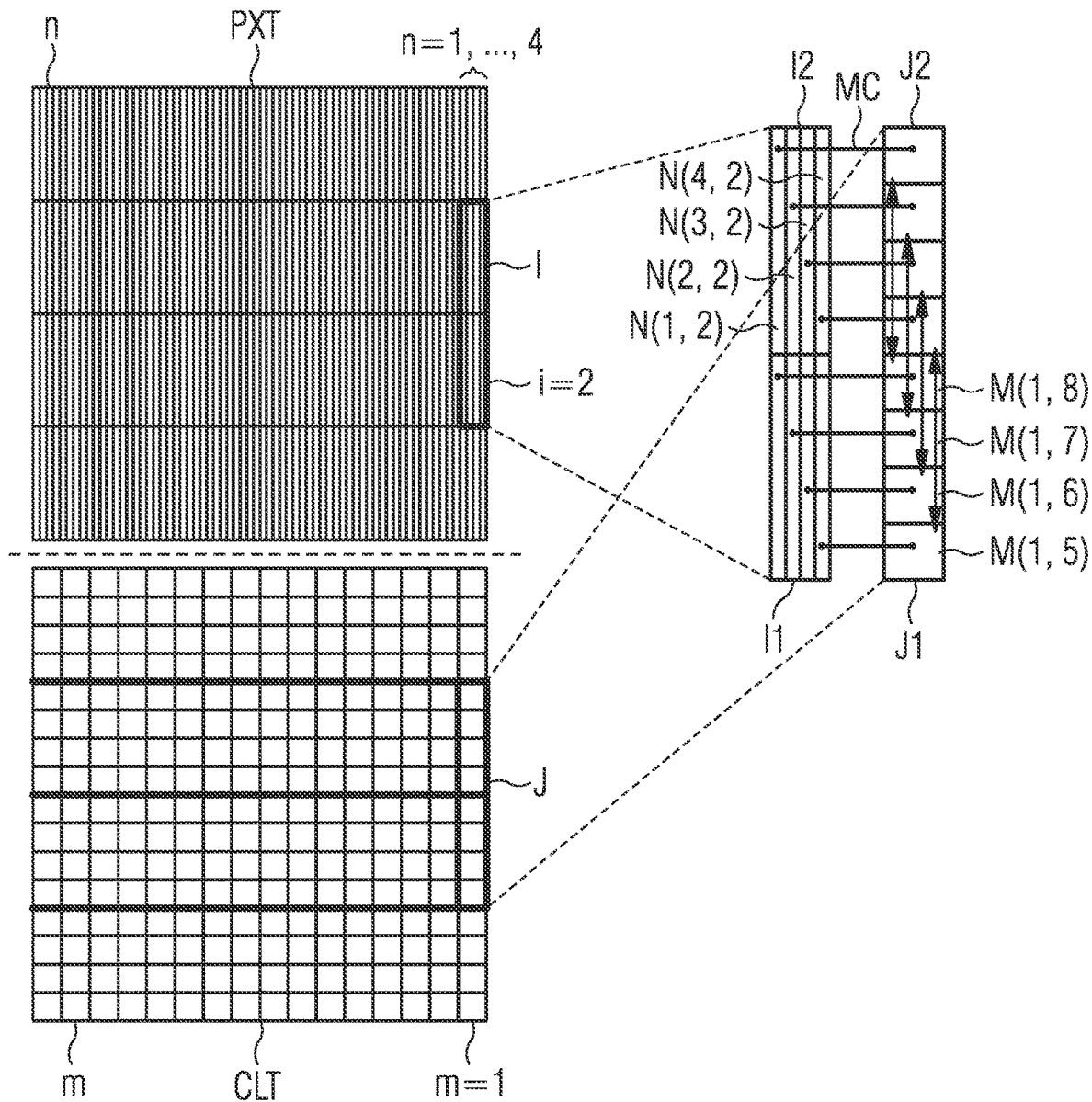
FIG. 5 shows another exemplary stacked image sensor according to the proposed concepts.

FIG. 5 shows another exemplary stacked image sensor according to the proposed concepts. The drawing depicts an embodiment, wherein a pitch of stages in the control logic tier CLT can be decoupled from a pitch of the columns in the pixel array tier PXT.

The pixel array tier PXT comprises the array of pixels arranged into pixel columns n and sub-columns N(n,i). Each sub-column N(n,i) comprises the same number of pixels and the sub-columns are arranged parallel with respect to each other. Furthermore, the array of pixels is subdivided in groups of sub-columns I. Similarly, the control logic tier CLT the array of analog-to-digital-converters ADC(m) arranged into ADC columns m. Each analog-to-digital-converter ADC(m) comprises the same number of stages M(m,j) and the analog-to-digital-converters are arranged parallel with respect to each other and column-parallel with respect to the columns n when viewed in projection. Furthermore, the array of analog-to-digital-converters ADC(m) is subdivided in groups of stages J.

Figure 6:
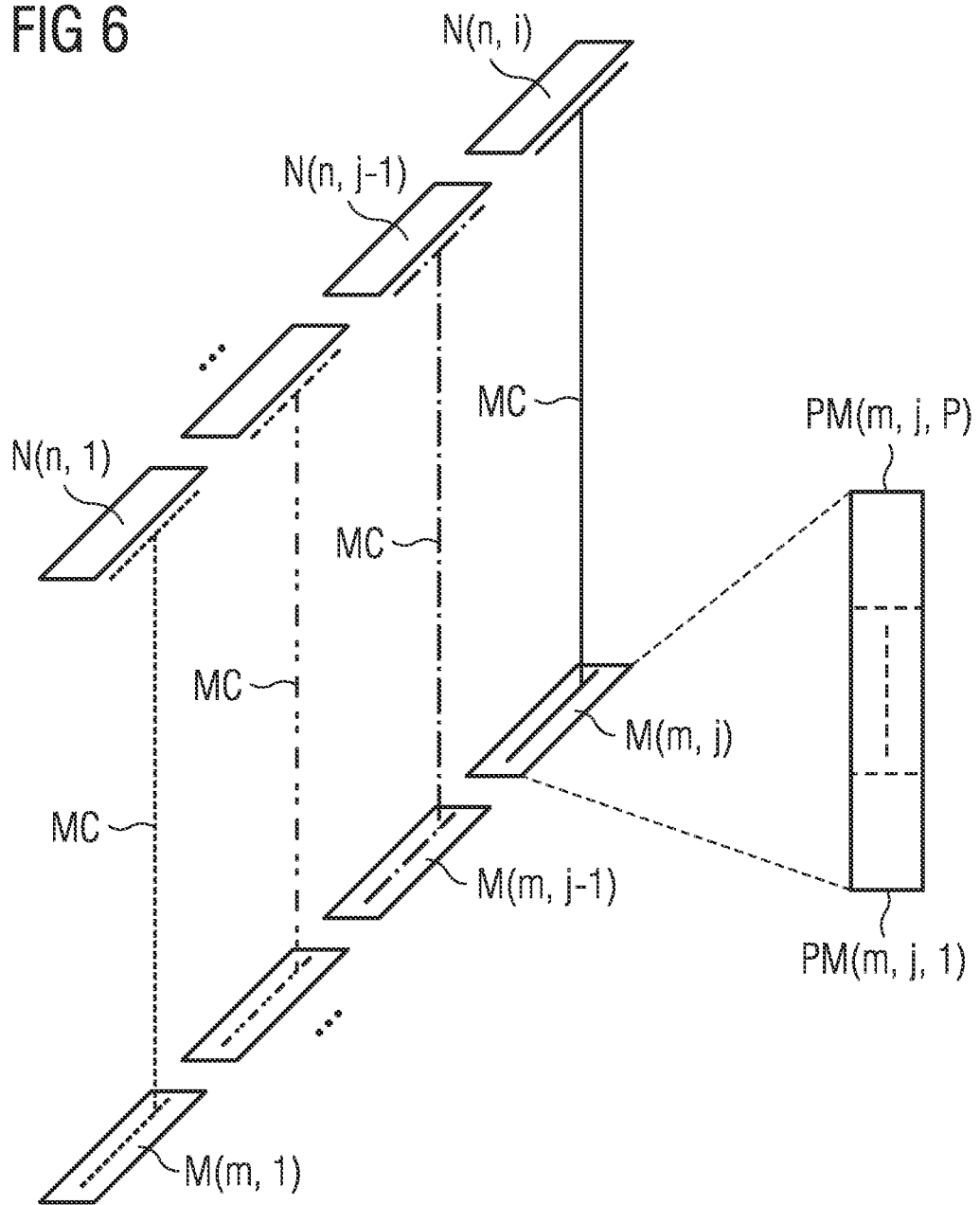
FIG. 6 shows another exemplary readout method according to the proposed concepts.

A first group of sub-columns I1 is arranged on top of a first group of stages J1 of ADC stages stacked in series. A second group of sub-columns I2 is arranged on top of a second group of stages J2 of ADC stages stacked in series and so on. In FIG. 5 the groups of sub-columns I are placed on top of groups of stages J that comprise four ADC stages each, respectively. The sub-columns of one group are electrically interconnected to the stages of a dedicated group of stages, e.g. by micro-contacts. For example, the first group of sub-columns I1 comprises the sub-columns N(1,2), N(2,2), N(3,2), N(4,2). The dedicated first group of stages J1 comprises the stages M(1,5), M(1,6), M(1,7), M(1,8) (see FIG. 5, right hand side). Sub-column N(1,2) is connected to stage M(1,5) as dedicated input stage. Sub-column N(2,2) is connected to stage M(1,6) as dedicated input stage. Sub-column N(3,2) is connected to stage M(1,7) as dedicated input stage. Sub-column N(4,2) is connected to stage M(1,8) as dedicated input stage. This scheme applies to the remaining groups as well. The shape of the analog-to-digital converters ADC(m) can now become wider than the column pitch, simplifying the layout at the cost of a slight increase of the load of each stage (adjacent stages of an ADC are now further from each other). FIG. 6 another exemplary stacked image sensor according to the proposed concepts. The drawing depicts an embodiment to decouple the number of sub-columns from the number of stages of an analog-to-digital converter.

Consider an analog-to-digital converter ADC(m) in column m comprising M stages. In this embodiment each stage M(m,j) of the ADC(m) has been split into a number of P sub-stages PM(m,j,1), . . . , PM(m,j,P). An input of the neighboring stage M(m,j−1) is applied to the first sub-stage PM(m,j,1) while an output of sub-stage PM(m,j,p) constitutes the output of sub-stage M(m,j). This implementation allows the reusability of an ADC stage in different sensor implementations, e.g. different array resolution, pixel pitch, improved accuracy etc.

Figure 7:
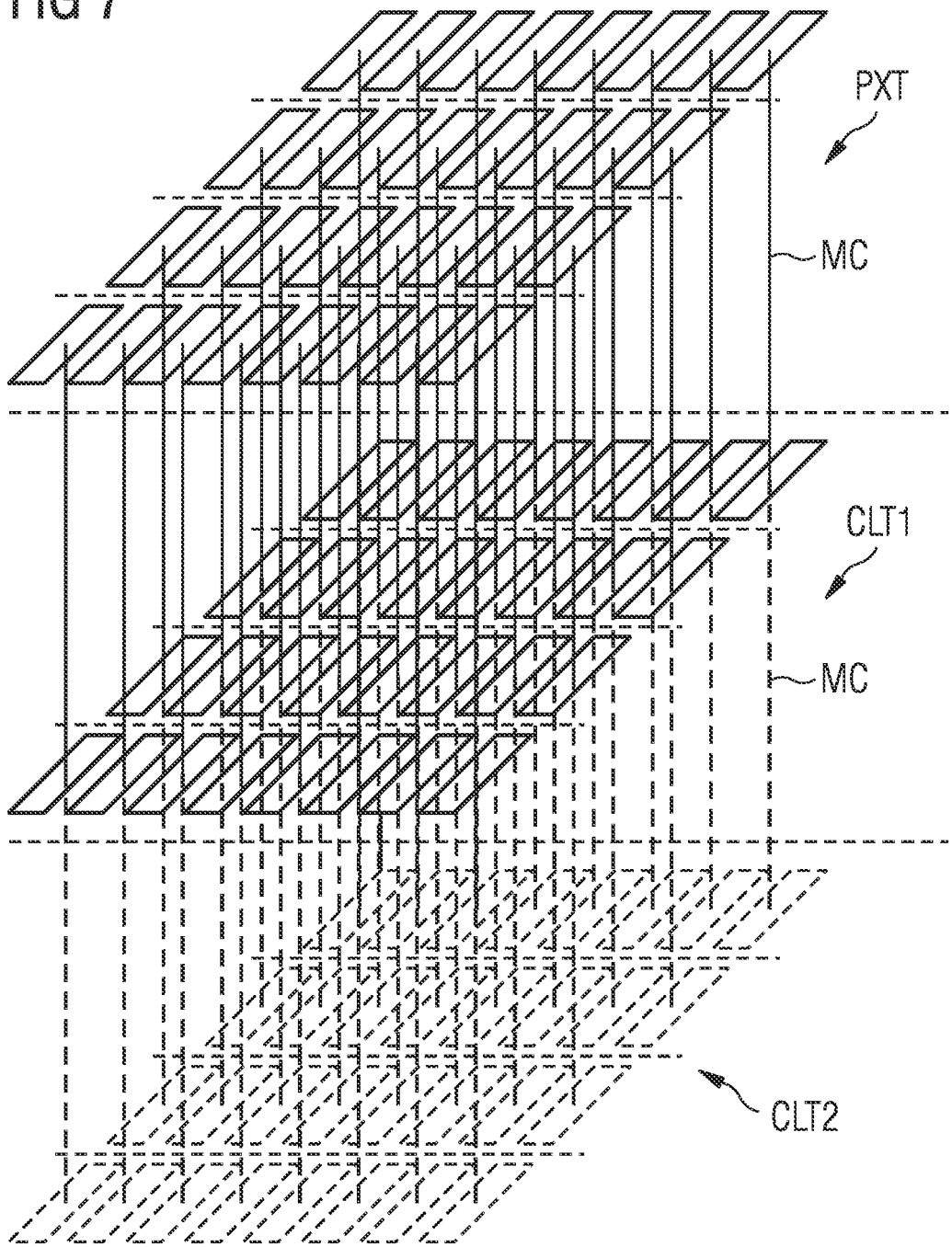
FIG. 7 shows another exemplary stacked image sensor according to the proposed concepts.
Figure 10:
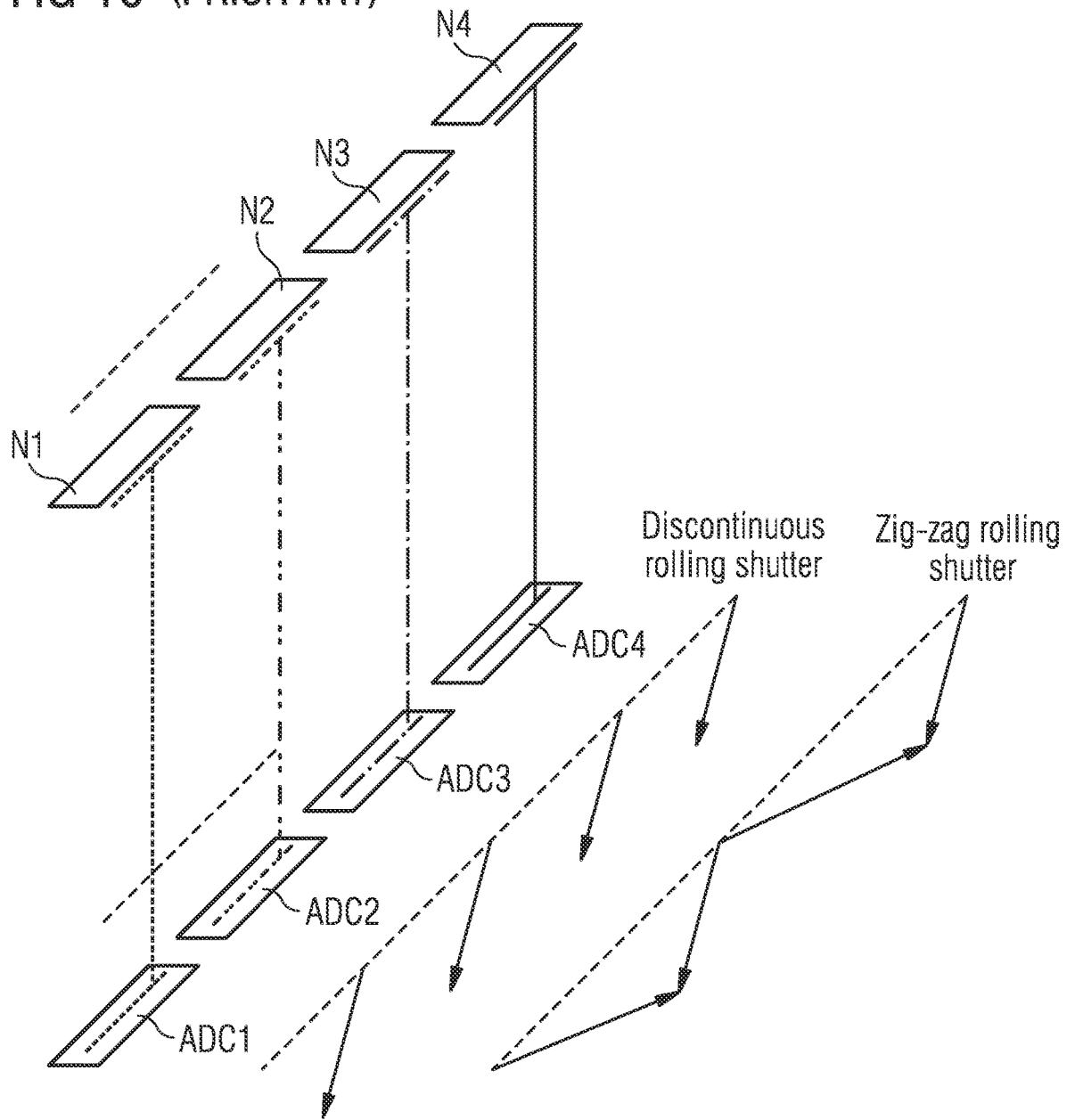
FIG. 10 shows a prior art column of a stacked image sensor.

FIG. 7 shows another exemplary stacked image sensor according to the proposed concepts. The components of the proposed image sensor can also be based on more than two tiers. FIG. 7 an embodiment where each stage M(m,j) of an analog-to-digital converter ADC(m) is split and arranged into multiple control logic tiers. This can be manufactured by means of 3D-stacking technology. In this example, the control logic tier is implemented as a first tier CLT1 and a second tier CLT2. Electrical interconnection are established between the tiers by vertical contacts such as micro-contacts or other technologies such as through-silicon vias. The number of tiers, however, is not restricted to two and up to n tiers can be stacked together. This splitting allows for smaller stages, hence, for a higher parallelism. Eventually, more processing elements can be placed in the successive tiers, improving the performance of the ADCs. This way a given tier can be optimized for analog readout while another tier can be optimized for digital readout, for example. In one embodiment (not shown) first tier CLT1 comprises analog components such as amplifiers to amplify the quantization error signal etc.

The second tier CLT2 comprises digital components such as ADC, DAC and logic components. This way analog amplification is performed on the first tier CLT1 while digital conversion is performed on the second tier CLT2. There could even be a third tier comprising collecting logic for the digital code generated from digital conversion.

Typically, multi-stage ADCs such as pipeline ADCS, have a rather strict requirement on noise and speed on the first stage while the successive stages are progressively relaxed. To achieve the same functionality in the proposed image sensors, the ADC stages can be made reconfigurable. When converting the LSB, the stages can be reconfigured into a mode with lower power consumption and lower accuracy. Such reconfiguration can for instance be done after the readout of the last pixel of a sub-column.

In another embodiment (not shown), the ADC stages can be reconfigured to read the sub-columns in parallel. In that case, at the start of A/D conversion, each ADC stage samples a pixel signal from its own sub-column above. The sampled values are then inserted in the conversion loop and converted. In other words, by means of reconfiguration there could be a global shutter mode and a rolling shutter mode and readout. In the rolling shutter mode, rolling shutter discontinuity and/or zig-zag effects would appear in the image. Therefore, the proposed concept is suited for global shutter sensors. The advantage is the simplicity in shifting the digital code from the ADCs in the middle to the periphery.

Figure 11:
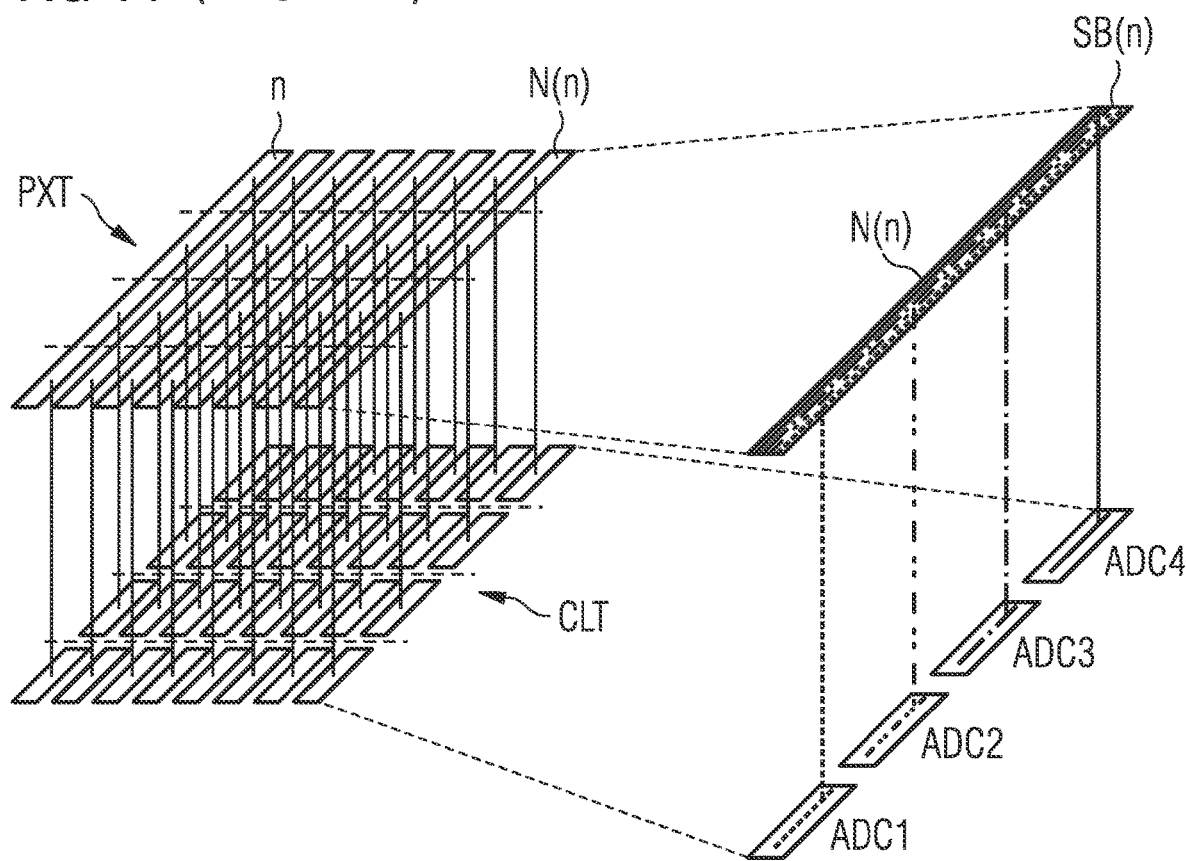
FIG. 11 shows another prior art stacked image sensor.

The proposed concepts offers a number of beneficial aspects. As each sub-column of pixels can be directly connected to the dedicated ADC stage below it, there is no need for long signal buses along the entire column, thereby reducing the bus capacitance and resistance by a factor of N compared to the solution of FIG. 11. The pixels are readout sequentially, thus avoiding the rolling shutter discontinuity as in FIG. 8 but at the same time maintaining the ADC parallelism as all the stages of the ADCs can be run in parallel. In contrast to both implementations of FIGS. 8 and 11, where a code of e.g. 12-bits has to be transferred from the ADCs along the column path towards the peripheral circuits, in the proposed concept small packets of bits (e.g. 1-bit) are shifted sequentially from stage to stage until the output reaches the periphery. If windowing is used, fewer pixels per column would have to be read out. In FIG. 8, fewer pixels would mean fewer sub-columns hence fewer ADCs would be activated, with little improvement on the frame rate. In the proposed concept, however, even if fewer sub-columns are used, all the stages of the ADCs would be in use, improving the frame rate proportionally to the windowing factor. Finally, to speed up the pixel readout operation, hence to improve the frame rate, the parallelism is increased by splitting each column of the pixel array tier into multiple sub-columns.

We claim:

1. An image sensor comprising a stack having at least a pixel array tier and a control logic tier, wherein:
    the pixel array tier comprises an array of pixels arranged into pixel columns, wherein each pixel column comprises a number of N sub-columns, each sub-column denoted by N(n,i) with $1 \le i \le N$,
    the control logic tier comprises an array of analog-to-digital-converters arranged into ADC columns, wherein each analog-to-digital converter comprises a number of M stages, each stage denoted by M(m,j) with $1 \le j \le M$, wherein
    each respective sub-column N(n,i) is electrically connected to a dedicated stage M(m,j=i) and the stages M(m,j) are electrically interconnected to form the analog-to-digital converters, respectively, and wherein
    the control logic tier is arranged to sequentially read out the sub-columns N(n,i), wherein the stages M(m,j=i) dedicated to the sub-columns N(n,i) are arranged as input stages to sequentially receive signal levels of the pixels in the sub-columns N(n,i), respectively, and are arranged to perform on the sequentially received signal levels a coarse first analog-to-digital conversion, and wherein remaining stages M(m,j≠i) are arranged to sequentially perform finer analog-to-digital conversions of the received signal levels.

2. The image sensor according to claim 1, wherein every sub-column N(n,i) in the pixel array tier is electrically interconnected with a dedicated stage M(m,j=i) in the control logic tier.

3. The image sensor according to claim 1, wherein a number N' of sub-columns in the pixel array tier are connected to dedicated stage M(m,j=i) in the control logic tier, wherein, the number of sub-columns N' either:
    is greater than the number of stages M, or
    is smaller than the number of stages M.

4. The image sensor according to claim 1, wherein the stages M(m,j) in the analog-to-digital converters are mono-directional or bi-directional.

5. The image sensor according to claim 1, wherein each of the analog-to-digital converters comprises
    a pipeline analog-to-digital-converter,
    a ramp analog-to-digital-converter,
    an extended counting type analog-to-digital-converter, and/or
    a successive approximation type analog-to-digital-converter.

6. The image sensor according to claim 1, wherein each stage is arranged to perform a most significant bit and least significant bit conversion.

7. The image sensor according to claim 1, wherein the pixel array tier and/or the control logic tier comprises peripheral logic and/or digital drivers.

8. The image sensor according to claim 7, wherein the control logic tier further comprises sub-control tiers and wherein at least one of stages M(m,j), peripheral logic and/or digital drivers are distributed over the sub-control tiers.

9. The image sensor according to claim 1, wherein the electrical interconnections between pixel sub-columns in the pixel array tier and their corresponding dedicated stages M(m,j=i) in the control logic tier comprise at least one of metal contacts, through-substrate vias or through silicon vias.

10. A method for readout of an image sensor comprising a stack comprising:
    at least a pixel array tier with an array of pixels arranged into pixel columns, wherein each column comprises a number of N sub-columns, and
    a control logic tier with an array of analog-to-digital-converters (ADC(m)) arranged into ADC columns (m), wherein each analog-to-digital converter (ADC(m)) comprises a number of M stages;
    the method comprising:
    sequentially reading out the sub-columns N(n,i) pixel-by-pixel using stages M(m,j=i) dedicated to the sub-columns N(n,i) as input stages to sequentially receive signal levels of the pixels in the sub-column N(n,i), respectively,
    performing on the sequentially received signal levels a coarse first analog-to-digital conversion using the dedicated input stages M(m,j=i), respectively,
    sequentially performing finer analog-to-digital conversions of the received signal levels using the remaining stages M(m,j≠i), respectively.

11. The method according to claim 10, wherein the sub-columns N(n,i) are selected in a sequence from 1 to N, and for each selected sub-column N(n,i) the following steps are repeated pixel-by-pixel:
    reading out a signal level of a pixel in the selected sub-column N(n,i) and receiving the signal level at the dedicated stage M(m,j=i) as input stage,
    generating a first digital and a first quantization error signal as a result of the coarse first analog-to-digital conversion on the received signal level using the dedicated input stage M(m,j=i),
    sequentially performing finer further analog-to-digital conversions using the remaining stages M(j±1), M(j±M) thereby sequentially generating further digital code and quantization error signals and shifting said further digital code and quantization error signals to one of more of the remaining stages M(j±1), . . . , M(j±M) and,
    constructing from the generated digital code a final digital code indicative of the read out signal level.

12. The method according to claim 10, wherein the first digital code of a pixel being read out results from determining a most significant bit MSB and wherein the further digital code from said pixel result from determining a least significant bit LSB, respectively.

13. The method according to claim 10, wherein the pixels from a selected sub-column N(n,i) are processed in parallel such that after the first digital code from a first pixel has been determined and finer further analog-to-digital conversions are performed on said pixel, another pixel is selected and readout by the dedicated stage M(m,j=i) and a respective another first digital code from the another pixel is determined.

14. The method according to claim 10, wherein the sequential performing of first coarse and subsequent finer analog-to-digital conversions is performed mono-directional involving shifting of the respectively generated digital code and quantization error signals to just a single stage of the remaining stages M(j+1), . . . , M(j+M) at a time.

15. The method according to claim 10, wherein the sequential performing of first coarse and subsequent finer analog-to-digital conversions is performed mono-directional involving shifting of the respectively generated digital code and quantization error signals to more than just a single stage of the remaining stages M(j±1), . . . , M(j±M) at a time.

* * * * *